United States Patent [19]

Gerard et al.

[11] Patent Number: 5,343,057
[45] Date of Patent: Aug. 30, 1994

[54] THIN FILM, FIELD EFFECT TRANSISTOR WITH A CONTROLLED ENERGY BAND

[75] Inventors: Jean-Michel Gerard, Paris; Jacques Favre, Versailles, both of France

[73] Assignee: France Telecom Establissement Autonome de Droit Public, Paris, France

[21] Appl. No.: 907,826

[22] Filed: Jul. 2, 1992

[30] Foreign Application Priority Data

Jul. 8, 1991 [FR] France .................. 91 08544

[51] Int. Cl.[5] .............................. H01L 29/38
[52] U.S. Cl. .................. 257/192; 257/194; 257/20; 257/22
[58] Field of Search .......... 257/192, 194, 195, 20, 257/24, 27, 215, 22, 17

[56] References Cited

U.S. PATENT DOCUMENTS 5,140,386  8/1992  Huang et al. ............... 257/194

FOREIGN PATENT DOCUMENTS 2646290  10/1990  France .
0311772  12/1988  Japan .

OTHER PUBLICATIONS

Y. J. Chan et al., Institute of Physics Conference Series, 1988 pp. 459–464.
K. Matsumura et al., Japanese Journal of Applied Physics, Part 2, vol. 30, No. 2A, 1991, pp. L166–L169.

Primary Examiner—Rolf Hille
Assistant Examiner—David B. Hardy
Attorney, Agent, or Firm—Hayes, Soloway, Hennessey, Grossman & Hage

[57] ABSTRACT

This transistor incorporates at least one first stack of semi-conductor conduction layers and at least one second stack of semiconductor layers with a single, highly doped thin film within the second stack giving it the character of a mobile electric charge donor, superimposed and supported by a substrate as well as at least two potential barriers located in the second stack on either side of the doped thin film in order to reduce the concentration of carriers in said second stack a metal gate resting on the second stack for modifying the concentration of carriers of the charges in the first stack, two ohmic contacts being placed on one of the stacks, on either side of the gate and serving as the source and drain.

12 Claims, 3 Drawing Sheets

THIN FILM, FIELD EFFECT TRANSISTOR WITH A CONTROLLED ENERGY BAND

FIELD OF THE INVENTION

The present invention relates to a thin film, field effect transistor having a controlled energy band, more particularly usable for producing electronic or optoelectronic circuits in particular intended for use in the fields of telemetry, integrated optics and telecommunications.

More specifically, the invention relates to semiconductor structures having one or more conduction channels and with modulated mobile charges, such as field effect transistor structures of the TEGFET type (two-dimensional electron gas field effect transistor) and structures derived from the TEGFET such as HEMT transistors (high electron mobility transistors), MODFET (modulation or doped field effect transistor) and DMT (doped metal-insulant-semiconductor (MIS) transistor).

BACKGROUND OF THE INVENTION

The principle of these field effects transistors is well known.

Thus, reference can be made to IEEE Transactions on Electron Devices, vol. ED-29, No. 6, June 1982, D. Delagebeaudeuf and N. T. Linh, "Metal-(n) AlGaAs-GaAs two-dimensional electron gaz FET", pp. 955-960 describing the operation of a TEGFET and IEEE Transactions on Electron Devices, vol. 35, No. 7, July 1988, M. C. Foisy et al., "The role of inefficient charge modulation in limiting the current-gain cutoff frequency of the MODFET", pp. 871-878 describing the operation of a MODFET.

This type of structure is obtained by stacking semiconductor layers of different types, which can be doped or undoped and which are deposited on a generally semiinsulating substrate material. Operation is based on the principle of transferring electric charges (electrons or holes) from certain doped layers, constituting the mobile electric charge donor layers, to other doped or undoped layers constituting the conduction channel or channels of the transistor. A metal gate placed on the surface of the semiconductor structure makes it possible to modify the charge carrier concentration in each of these layers and control the conduction properties of the component. On said semiconductor layer stack there are also two sources and drain metal contacts on either side of the gate.

In this type of structure, one of the essential factors for improving the performance characteristics, particularly in ultra-high frequency, is the spatial distribution of the mobile charge carriers, electrons or holes.

The volume of the component is subdivided into two subdomains on the one hand the electric conduction channels (SD1) and on the other the other semiconductor layers (SD2), such as the mobile electric charge donor layers and the buffer layers generally interpose between the substrate and the conduction channels.

The concentration of mobile charges in one of these subdomains of the component is defined as being, for a given miniband, the product of the concentration of the carriers for said miniband by the presence probability of a carrier of said miniband in the considered subdomain. The total concentration of mobile charges in the subdomain SD1 is called NS1 and that in the subdomain SD2 is called NS2.

1) Cutoff frequency

The cutoff frequency Fc of the current gain of the component can be considered as proportional to the ratio:

$$Fc = 1/\left(1 + \frac{dNS2/dVg}{dNS1/dVg}\right) = 1/\left(1 + \frac{dNS2}{dNS1}\right)$$

in which Vg is the potential applied to the gate.

No matter what the considered application (low noise transistor, power transistor, etc.) for a given operating frequency and therefore a fixed maximum ratio dNS2/dNS1, an attempt is always made to have the largest possible range of values for NS1, i.e. $0 < NS1 < N1\lim$ is the maximum limit value of NS1. However, on modifying the gate voltage Vg for increasing NS1, there is a simultaneous increase of the ratio dNS2/dNS1.

Various means have been studied for improving the performance characteristics of field effect transistors, via an increase in the discontinuity of the bands (conduction it transport is by electrons, if not valency).

In order to improve the efficiency of the charge transfer and reduce the dNS2/dNS1 with given NS1, two solutions have been envisaged:

a—modifying the mobile charge donor layer or layers (or subdomain SD2), b—modifying the material in which conduction takes place (or subdomain SD1).

a—The alloys of doped III-V or II-VI materials commonly sued as charge donor layers (SD2) introduce carrier traps linked with doping atoms, such as the centre DX in III-V alloys containing aluminum. The binding energy is then high, which limits the efficiency of the transfer of charges from layers SD2 to layers SD1.

It is the existence of these localized states (or trapped carriers) in the subdomain SD2, which limits the performance characteristics of the transistors produced on GaAs or InP substrate, such as those described in the document by L. D. Nguyen et al., Proc. IEEE/Cornell Conf. 1987, pp. 60-69 "AlGaAs/InGaAs modulation-doped field effect transistors (MODFET's)".

On a GaAs substrate, these effects would seem to be limited for the alloy $In_{0.51}Ga_{0.49}P$ adapted from the crystal lattice standpoint, but the height of the heterojunction is less than that accessible in the AlGaAs/GaAs system.

In the case of AlGaAs/GaAs structures, it has also been considered to substitute the ternary alloy AlGaAs by a relatively short period superlattice, typically below 5 nm. This superlattice consists of an alternation of thin GaAs and AlAs films. Only the GaAs films are doped. Such a structure is described in Proc. IEEE/Cornell Conf., pp. 199-208, 1985, by L. H. Camnitz "The role of charge control on drift mobility in AlGaAs/GaAs MODFET's".

The object of the sublattice is to obtain a material, whose band structure is very close to that of the ternary alloy AlGaAs, but where the bonding energy of the charge donor impurities is low. This procedure should, a priori, make it possible to increase the mean aluminum composition of the charge donor layers by eliminating the centre DX and therefore increasing the efficiency of the transfer of the mobile charges from the charge donor layers to the conduction layers. However, this solution has not led to any improvement and has consequently not been adopted by field effect transistor designers and manufacturers.

b—With regards to the modification of the material used for conduction, subdomain SD1, the alloys of $In_xGa_{1-x}As$, mismatched with respect tot he lattice parameter, have been widely used both on a GaAs substrate with $0 < x \leq 1$ and on an InP substrate with $0.35 < x \leq 1$, respectively in place of GaAs and $In_{0.53}Ga_{0.47}As$.

Reference can be made in this connection to the article by N. Moll et al., IEEE Transactions on Electron Devices, vol. 35, No. 7, July 1988, pp. 879-886, "Pulse-doped AlGaAs/InGaAs pseudomorphic MODFET's", relative to the use of $In_{0.25}GA_{0.75}As$ on GaAs.

InGaAs alloys have a smaller forbidden energy band than that of GaAs or $In_{0.53}Ga_{0.47}As$, so that it is possible to increase the band discontinuities. Their crystal mesh parameters are, however, different from those of GaAs and InP and consequently there are constrains in connection therewith. Therefore this limits the usable indium composition range, typically $0 < x < 0.25$ on GaAs and $0.53 < x < 0.65$ on InP.

Thus, the limitation of the number of materials, whose lattice parameter is sufficiently close to that of the nominal or base material makes it impossible to find novel combinations reducing the ratio dNS2/dNS1.

2) High current applications

The drain current available in such transistors is typically the product of NS1lim by the average speed of the carriers beneath the gate. For a given form, the latter is essentially dependent on the nature of semiconductor layers. The possible solutions and their limits are given in paragraphs a nd b.

3.) Linearity

In these transistors, an attempt is also made to obtain an as linear as possible current-voltage response. However, the linearity of the response of a transistor is affected by the modification of the distribution of the electrical charges in the structure between the subdomains (SD1 and SD2) and within the subdomain SD1.

More precisely, the presence probability densities associated with each of the minibands are deformed with the change of voltage applied to the gate, which leads to a modification in the average position of the electrons relative to the gate. This introduces a non-linear voltage variation of the carrier concentration in the conduction channels. The use of AlGaAs/InGaAs/AlGaAs structures in place of AlGaAs/InGaAs/GaAs structures has already made it possible to limit this effect. In this connection reference can be made to the article by C. Gaonach et al., Proc. GaAs and related Compounds, Jersey, 1990, "Characterization of pseudomorphic HEMT structures AlGaAs/InGaAs/AlGaAs".

With a view to optimizing the dNS2/dNS1 ratio in the HEMT, use has also been made of a local disturbance of the potential energy of the structure in order to selectively modify the self-energies and wave functions at the considered point of the studies minibands, liable to be populated by carriers. Thus, the theory of disturbances in quantum mechanics shows that the effect of introducing such as localized potential disturbance causes a displacement of the self-energy which increases with the overlap of said potential with the presence probability in the undisturbed system. Such a localized disturbance is obtained by changing the material of a thin film of the structure.

Thus, it has been envisaged to introduce an InAs monolayer into the conduction channel of the AlGaAs/GaAs and AlGasAs/InGaAs structures producing a potential well. This is described in Japanese Journal of Applied Physics, vol. 30, No. 2A, February 1991, pp. L166-L169, "a new high electron mobility transistor (HEMT) structure with a narrow quantum well formed by inserting a few monolayers in the channel" by K. Matsumura et al.

The introduction of this potential well at a given point increases the presence probability at this point and increases its population by reducing its energy, particularly if the presence probability density is high at this point prior to the disturbance.

Moreover, FR-A-2,646,290 envisages the introduction of a thin AlInAs film, doped on the border of the conduction channel of an AlGaAs/InGaAs/GaAs structure in order to create a tunnel barrier between the conduction stack and the donor stack, to avoid the passages of electrons from the former to the latter (dynamic effect). However, in actual fact this concept failed.

SUMMARY OF THE INVENTION

The invention relates to a thin film, field effect transistor with a controlled energy band having improved properties compared with those known at present. In particular, the invention makes it possible to act selectively on a quantum level by the insertion of thin films in the conduction channels and mobile charge donor layers, serving respectively as the potential well and barrier. Compared with the known transistors, it leads to an improvement with respect to the operating frequencies, the current density of the drain which is usable and the response linearity of these components.

More specifically, the invention relates to a field effect transistor having a semiconductor substrate, at least one first stack of semiconductor conduction layers and at least one second stack of semiconductor, mobile electric charge donor layers, which are superimposed and supported by the substrate, a single highly doped thin film within said second stack giving it its donor character, at least two potential barriers locate in said second stack, respectively on either side of the highly doped thin film, in order to reduce the concentration of carriers in said second stack, each barrier consisting of at least one insulating or semiconductor monolayer of a material having a forbidden energy band greater than those of the materials on the other layers of the second stack, a metal gate resting on the second stack to modify the concentration of charge carriers in the first stack, two ohmic contacts being placed on one of the stacks, on either side of the gate, and serving respectively as the source and drain.

The transistors to which the invention applies are more particularly constituted by the TEGFET and derivatives thereof such as the HEMT, MODFET and DMT.

The introduction of potential barriers at a given point of the semiconductor structure reduces the presence probability at this point of mobile carriers and depopulates the considered level by raising its energy and this applied to a greater extent if the presence probability density is high at this point prior to the disturbance.

The invention only functions for planar doping, i.e. introduced in an atomic plane, or in a thin film with a thickness typically below 5 nm.

The invention only functions when the doping plane is surrounded by two barriers, so as to effectively prevent the quantum levels from having a high presence probability in the vicinity of the doping plane.

The use of two barriers on either side of the doing plane means that at thermodynamic equilibrium the number of carriers is low in the free carrier donor layer stack. In other words the electrons in this case have no reason to pass into said stack, which is better than stopping them from passing (or attempting to do so) when they wish to do so.

Advantageously, the transistor also has at least one potential well in said first stack in order to increase the carrier concentration in the first stack, said well consisting of at least one semiconductor monolayer of a material with a forbidden energy band below those of the materials of the other layers of the first stack. The introduction of a potential well into the conduction bands increases the carrier presence probability in the conduction bands and therefore their population.

By using several potential barriers in the donor layers on either side of the charge donor plane and optionally one or more potential wells in the conduction layers, it is possible to increase the carrier density in the stack of electrical conduction layers (SD1) and reduce the carrier density in the stack of conduction layers (SD2), which makes it possible to reduce the dNS2/dNS1 ratio for a given NS1 or increase NS1 for a maximum possible value of the ratio dNS2/dNS1.

Moreover, the potential wells in the conduction stack make it possible to localize in the space certain levels and in particular the fundamental level. The presence probability density associated with such an energy level is then collected around the layer or layers, which create the attractive disturbance or disturbances. The potential barriers prevent the presence probability density associated with these levels from sliding towards the conduction layers (SD2) and enable it to remain compact for the entire range of voltages applied to the transistor gate.

The invention applies to any semiconductor assembly using heterojunctions making it possible to raise barriers and hollow out potential wells. Semiconductor materials with a large forbidden band width will usually form the potential barriers and materials with a smaller forbidden band width will in principle form the potential wells.

In particular, the invention applies to any III-IV, II-VI and IV-VI semiconductor structure. More particularly, the invention applies to structures on GaAs or InP substrates.

When the substrate is of GaAs, the layers of the first stack, other than the potential well or wells, are of $In_xGa_{1-x}As$ with $0 \leq x < 1$, the potential well or wells being of $In_{xo}Ga_{1-xo}As$ with $x < xo \leq 1$, the layers of the second stack, other than the potential barriers, are of $Al_yGa_{1-y}As$ with $0 < y \leq 1$ and the potential barriers are of $Al_{yo}Ga_{1-yo}As$ with $y < yo \leq 1$.

Preferably, for a GaAs substrate, the potential wells are of InAs and the potential barriers of AlAs. Moreover, AlGaAs with $0.20 < y < 1$ is used for the mobile charge donor layer stack, It is also possible in the case of a GaAs substrate to replace the AlGaAs donor layers by $In_zGa_{1-z}P$ layers with $0 < z \leq 0.7$ and the AlAs potential barrier by $In_{zo}Ga_{1-zo}P$ monolayers with $0 \leq zo \leq z$.

When the substrate is of InP, the layers of the first stack, other than the potential well or wells, are of $In_tGa_{1-t}As$ with $0.3 \leq t \leq 1$, the potential well or wells are of $In_{to}Ga_{1-to}As$ with $t < to \leq 1$, the layers of the second stack, other than the potential barriers, are of $Al_uIn_{1-u}As$ with $0.3 \leq u \leq 1$ and the potential barriers are of $Al_{uo}In_{1-uo}As$ with $u \leq uo \leq 1$. Preferably, for an Inp substrate, use is made of InAs potential wells and AlAs potential barriers.

In the case of CdTe substrates, use is made of conduction layers and charge donor layers of $Hg_{1-v}Cd_vTe$ with $0 \leq v \leq 1$, the barrier layers being obtained for compositions vo in Cd such that $vo > v$ and the potential wells are obtained for compositions in Cd such that $vo \leq v$, with v and vo exceeding 0.15, the material becoming semimetallic below this value.

The number of potential barriers and wells is determined in such a way as to optimize the electrical performance characteristics of the component. Moreover, the potential wells and barriers can in each case consist of one or more material monolayers.

The number of monolayers per barrier and well is in practice limited by the state of the art concerning the growth of these layers. The very mismatched layers from the standpoint of their crystal lattice (lattice mismatch > 2%) cannot be accumulated beyond a certain limit after which the deposited layer adopts a three-dimensional growth mode, which is incompatible with obtaining a high quality heterostructure.

Thus, at present this limit is two monolayers for InAs on GaAs. In the case of InAs on $In_{0.3}Ga_{0.7}As$, it is well below one monolayer, which makes it uninteresting to use InAs wells in $GaAs/Ga_{0.7}In_{0.3}As/GalAs$ structures.

However, such a limit does not occur when the inserted layer is quasi-matched to the substrate lattice parameter. This is the case with an AlAs layer on a GaAs substrate. Therefore AlAs barriers are very advantageous for use for GaAs/GaAlAs or GaAs/GaInAs/GaAlAs TEGFET structures.

According to the invention, a monolayer for a binary material III-V (respectively II-VI) corresponds to a layer of element III (respectively II) atoms, plus a layer of element V (respectively VI) atoms. In the same way, a monolayer of a ternary III-V (respectively II-VI) material corresponds to the stack of three atomic layers, with one atomic layer per ternary material element.

For example, for a GaAs substrate with AlGaAs donor layers and InGaAs conduction layers, it is possible to use two to five AlAs potential barriers having two monolayers each and a potential well constituted by an InAs monolayer.

For a GaAs substrate with AlGaAs charge donor layers and GaAs conduction layers, it is possible to use two to five AlAs barriers with two monolayers each and two InAs potential wells with two monolayers each.

For an InP substrate with AlInAs donor layers and InGaAs conduction layers, it is possible to use two to five AlAs barriers with two to four monolayers each and one to five InAs potential wells each constituted by two to four monolayers.

BRIEF DESCRIPTION OF THE DRAWINGS

The invention is described in greater detail hereinafter relative to non-limitative embodiments and with reference to the attached drawings, wherein shown.

DESCRIPTION OF THE PREFERRED EMBODIMENTS

Figure 1:
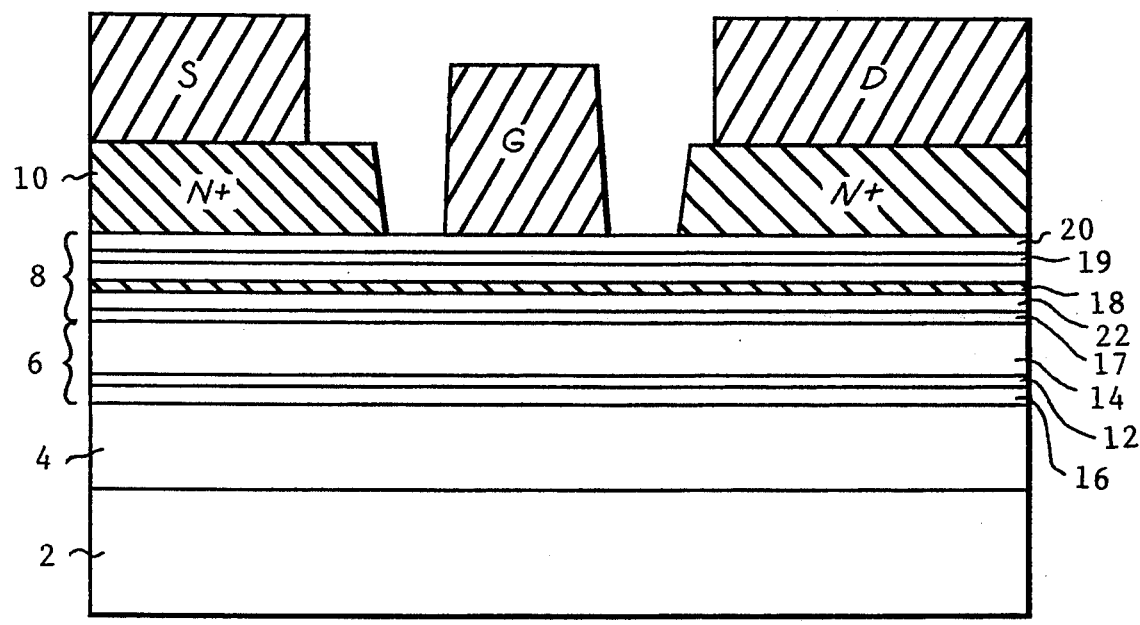
FIG. 1 diagrammatically a monochannel field effect transistor according to the invention.

FIG. 1 diagrammatically shows a monochannel field effect transistor of the TEGFET type according to the invention. This transistor has a material III-V, monocrystalline, semiinsulating substrate 2 supporting a not intentional doped buffer layer 4 having the same composition as the substrate 2 and with the aim of removing the active semiconductor layers from the substrate.

These active layers are constituted by a first stack 6 of III-V material, not intentionally doped, semiconductor layers constituting the conduction channel of the transistor and a second stack 8 of mobile charge donor, n+ doped, semiconductor layers. The conduction channel 6 is here sandwiched between the buffer layer 4 and the mobile charge donor stack 8.

On the upper surface of the active layers is provided a metal control gate G and two ohmic contacts S and D located on the active layers and on either side of the gate G and respectively serving as the source and drain. The electrical contacting respectively of the source and the drain on the active layers is ensured by a n+ doped, III-V material active layer 10, etched so as to electrically isolate the transistor gate from the source and drain.

According to the invention, the donor character of the stack 8 is ensured by a highly doped thin film 18 with a thickness below 5 nm. In addition, at least one potential well 12 is provided in the conduction stack 6, whilst at least two potential barriers respectively 17 and 19 are provided in the mobile charge donor stack 8. These barriers 17 and 19 are located on either side of the highly doped thin film 18.

The potential well 12 is constituted by a few monolayers of a not intentionally doped III-V material, whose forbidden energy band is below that of the other semiconductor layers 14,16 of the conduction stack 6.

In parallel, the potential barriers 17,19 are constituted by a few monolayers of a not intentionally doped III-V material, whose forbidden energy band is above those of the other semiconductor layers 20, 22 of the mobile charge donor stack 8.

For example, for a GaAs substrate 2, use is made of $In_xGa_{1-x}As$ conduction layers 14 and 16 with $0 \leq x < 1$, which are not intentionally doped, have a thickness of 2 to 20 nm, as well as one or more InAs potential wells 12, which are not intentionally doped, have a thickness of 0.6 nm (i.e. 2 monolayers), mobile charge donor layers 20,22 of $Al_yGa_{1-y}As$ with $0.20 < y < 1$ with a thickness of 2 to 20 nm and with a n+ doped layer 18, two or more AlAs barrier layers 17,19 with a thickness of 0.6 nm each (i.e. 2 monolayers), a not intentionally doped, 1 μm thick, GaAs buffer layer 4 and an etched, n+ doped, GaAs electrical contact layer 10 with a thickness of 100 nm.

The doping of the mobile charge donor stack 8 is obtained by interrupting the AlGaAs growth by depositing 1 to $10 \cdot 10^{12}$ atoms/cm$^2$ of Si and then resuming AlGaAs growth. This gives a so-called planar doping. Use is made of $10^{18}$ to $10^{19}$ atoms/cm$^3$ of silicon in the contact layer 10.

Examples will now be given of field effect transistors according to the invention, together with a counter-example. In these examples and counter-example, these layers will be given in order starting from the N+ doped semiconductor, electrical contacting layer and extending to the substrate.

EXAMPLE 1

This example relates to a TEGFET of type n-$Al_{0.22}Ga_{0.78}As/In_{0.15}Ga_{0.85}As/GaAs$ with a conduction monochannel and a planar doping of $5 \cdot 10^{12}$ ionized electron donor atoms/cm$^2$. This TEGFET has three AlAs potential barriers, each of two monolayers, and two InAs potential wells, with each having two monolayers.

| | Layer | Doping | Thickness |
|---|---|---|---|
| Contact | GaAs N+ | $2 \cdot 10^{18}$/cm$^3$ | 100 nm |
| | $Al_{0.22}Ga_{0.78}As$ | nid | 19 nm |
| | AlAs | nid | 0.6 nm |
| Donor stack | $Al_{0.22}Ga_{0.78}As$ | nid | 2.4 nm |
| | AlAs | nid | 0.6 nm |
| | $Al_{0.22}Ga_{0.78}As$ doping plane | $5 \cdot 10^{12}$ at · Si/cm$^2$ | — |
| | $Al_{0.22}Ga_{0.78}As$ | nid | 2.4 nm |
| | AlAs | nid | 0.6 nm |
| | $In_{0.15}Ga_{0.85}As$ | nid | 3 nm |
| Conduction stack | InAs | nid | 0.6 nm |
| | $In_{0.15}Ga_{0.85}As$ | nid | 4.8 nm |
| | InAs | nid | 0.6 nm |
| | $In_{0.15}Ga_{0.15}As$ | nid | 3 nm |
| Buffer | GaAs | nid | 1 μm |
| Substrate | GaAs | semiinsulating | — |

COUNTER-EXAMPLE

The counter-example relates to a TEGFET of type n-$Al_{0.22}Ga_{0.78}As/In_{0.15}Ga_{0.85}As/GaAs$, with a conduction monochannel and a planar doping of $5 \cdot 10^{12}$ ionized electron donor atoms/cm$^2$. The TEGFET is not disturbed and relates to the prior art.

| | Layer | Doping | Thickness |
|---|---|---|---|
| Contact | GaAs N+ | $2 \cdot 10^{18}$/cm$^3$ | 100 nm |
| Donor stack | $Al_{0.22}Ga_{0.78}As$ | nid | 29 nm |
| | doping plane | $5 \cdot 10^{12}$ at · Si/cm$^2$ | — |
| | $Al_{0.22}Ga_{0.78}As$ | nid | 3 nm |
| Conduction stack | $In_{0.15}Ga_{0.85}As$ | nid | 12 nm |
| Buffer | GaAs | nid | 1 μm |
| Substrate | GaAs | semiinsulating | — |

EXAMPLE 2

This example relates to a TEGFET of type n-$Al_{0.22}Ga_{0.78}As/GaAs$ with a conduction monochannel and planar doping of $5 \cdot 10^{12}$ ionized electric donor atoms/cm². This TEGFET has three AlAs potential barriers of two monolayers each.

| | Layer | Doping | Thickness |
|---|---|---|---|
| Contact | GaAs N+ | $2 \cdot 10^{18}/cm^3$ | 100 nm |
| | $Al_{0.22}Ga_{0.78}As$ | nid | 19 nm |
| | AlAs | nid | 0.6 nm |
| Donor stack | $Al_{0.22}Ga_{0.78}As$ | nid | 2.4 nm |
| | AlAs | nid | 0.6 nm |
| | $Al_{0.22}Ga_{0.78}As$ | nid | 2.4 nm |
| | doping plane | $5 \cdot 10^{12}$ at $\cdot$ Si/cm² | — |
| | $Al_{0.22}Ga_{0.78}As$ | nid | 2.4 nm |
| | AlAs | nid | 0.6 nm |
| Conduction stack | $In_{0.15}Ga_{0.85}As$ | nid | 12 nm |
| Buffer | GaAs | nid | 1 μm |
| Substrate | GaAs | semiinsulating | — |

Figure 2:
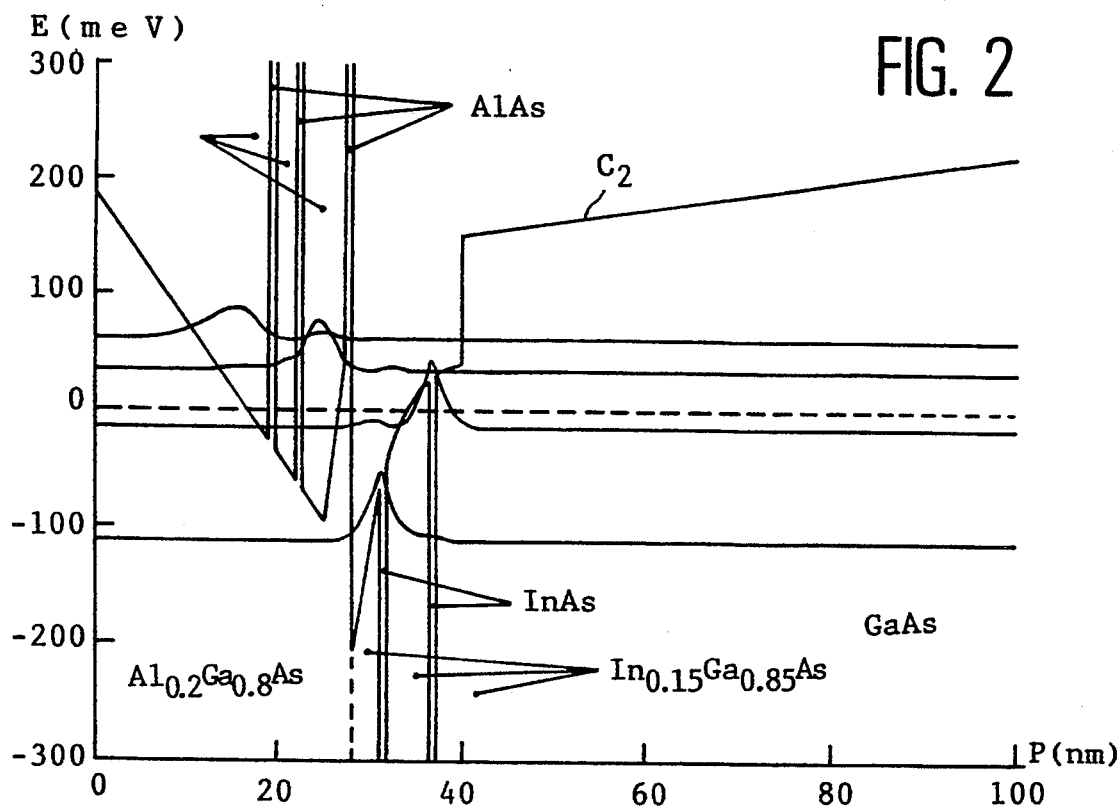
FIGS. 2, 3 and 4 profiles at the bottom of the conduction band, respectively of a transistor according to the invention having three potential barriers and two potential wells, a prior art transistor without disturbance and a transistor according to the invention with three potential barriers, when the total mobile charge concentrations NS2 in the mobile charge donor layers and the buffer layers (SD2) is approximately 10% of the electron concentration present in the conduction channel, said drawings giving the variations of the band energy (E), in meV, as a function of the position (p) in nm in the semiconductor structure, the position 0 corresponding to the surface of the active semiconductor layers in contact with the gate.
Figure 3:
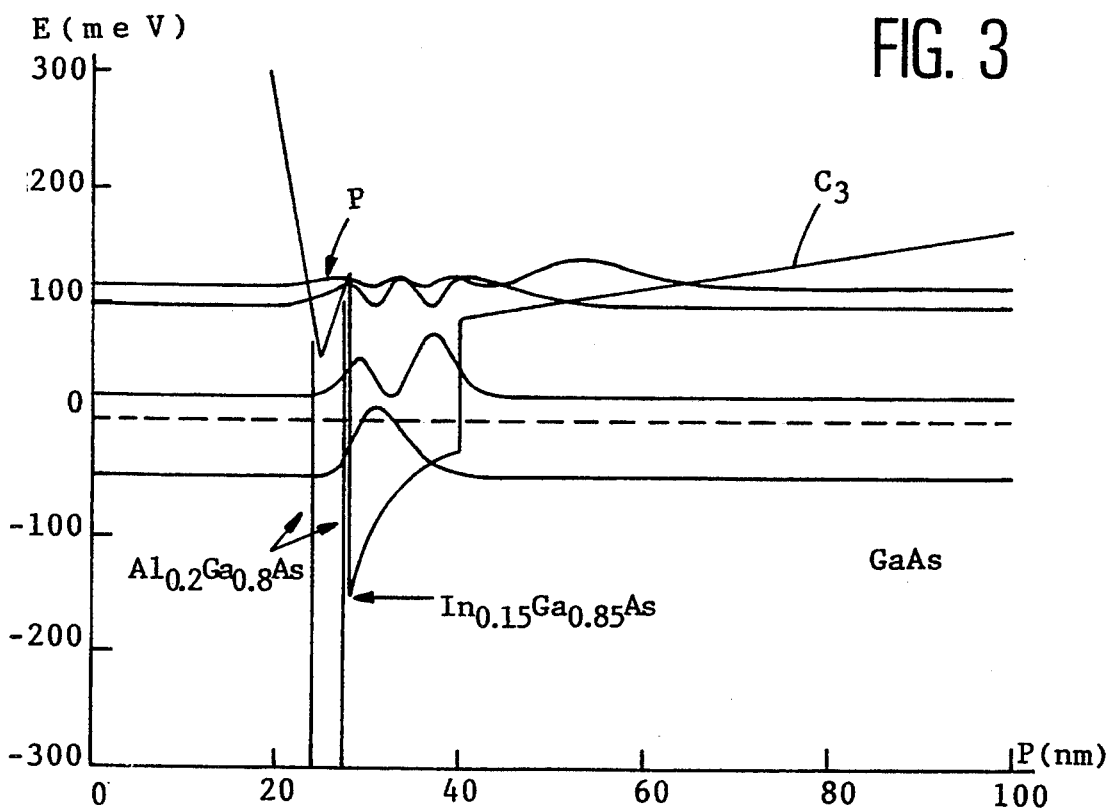
Figure 4:
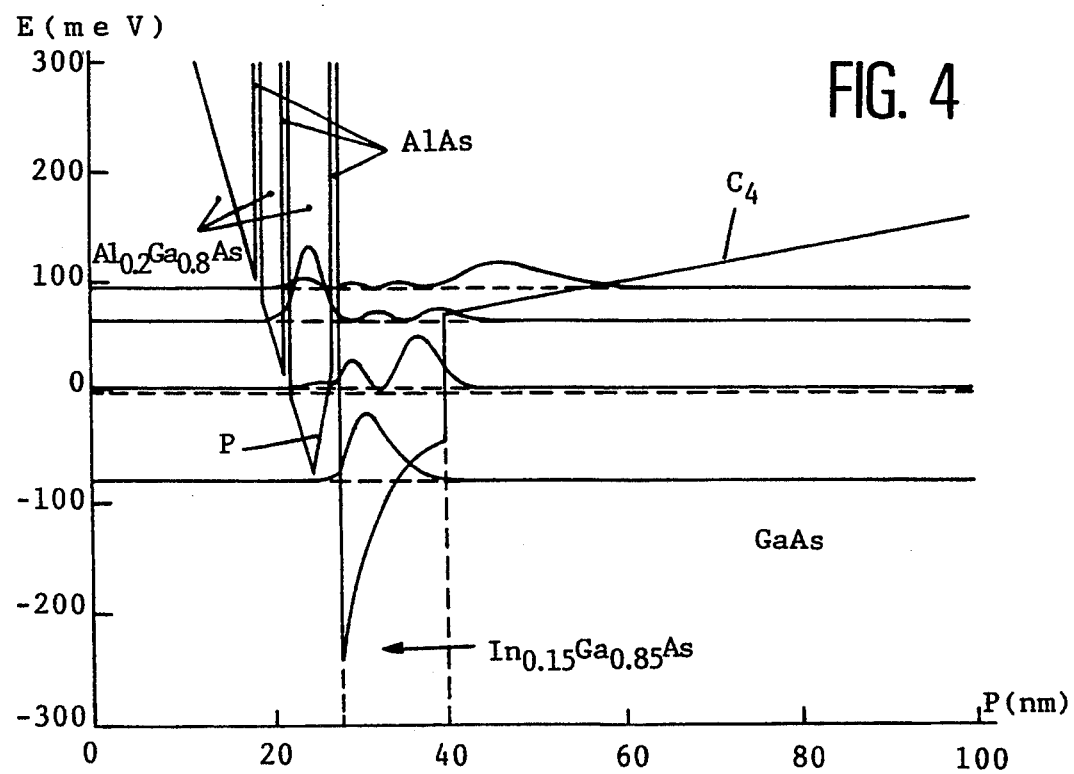

FIGS. 2, 3 and 4 respectively shown the profiles at the bottom of the conduction band of the TEGFET according to the invention (Example 1), the TEGFET according to the prior art of the counter-example and the TEGFET according to the invention (Example 2), when the electron concentration NS2 in the donor layers and buffer layer (subdomain SD2) is approximately 10% of the two-dimensional concentration of electrons NS1 present in the conduction channel. Thus, these drawings give the band energy variations E, in meV, as a function of the position p, in nm, in the semiconductor structure. The value p=0 corresponds to the upper surface of the donor stack 8 (surface in contact with the gate G).

In FIGS. 2, 3, and 4 mention has been made of the nature of the semiconductor layers of the transistors, P in FIGS. 3 and 4 indicating the doping plane of the donor layers, C2,C3 and C4 representing respectively the conduction band profiles of the disturbed transistor of Example 1, the undisturbed transistor of the counter-example and the disturbed transistor of Example 2.

On comparing FIGS. 2, 3 and 4, it can be seen that the InAs potential wells have the effect of lowering the energy of the two minibands present in the $In_{0.15}Ga_{0.85}As$ conduction stack and the AlAs barriers make it possible to partly prevent parallel conduction and thus raise the energy level of the minibands in question.

Figure 5:
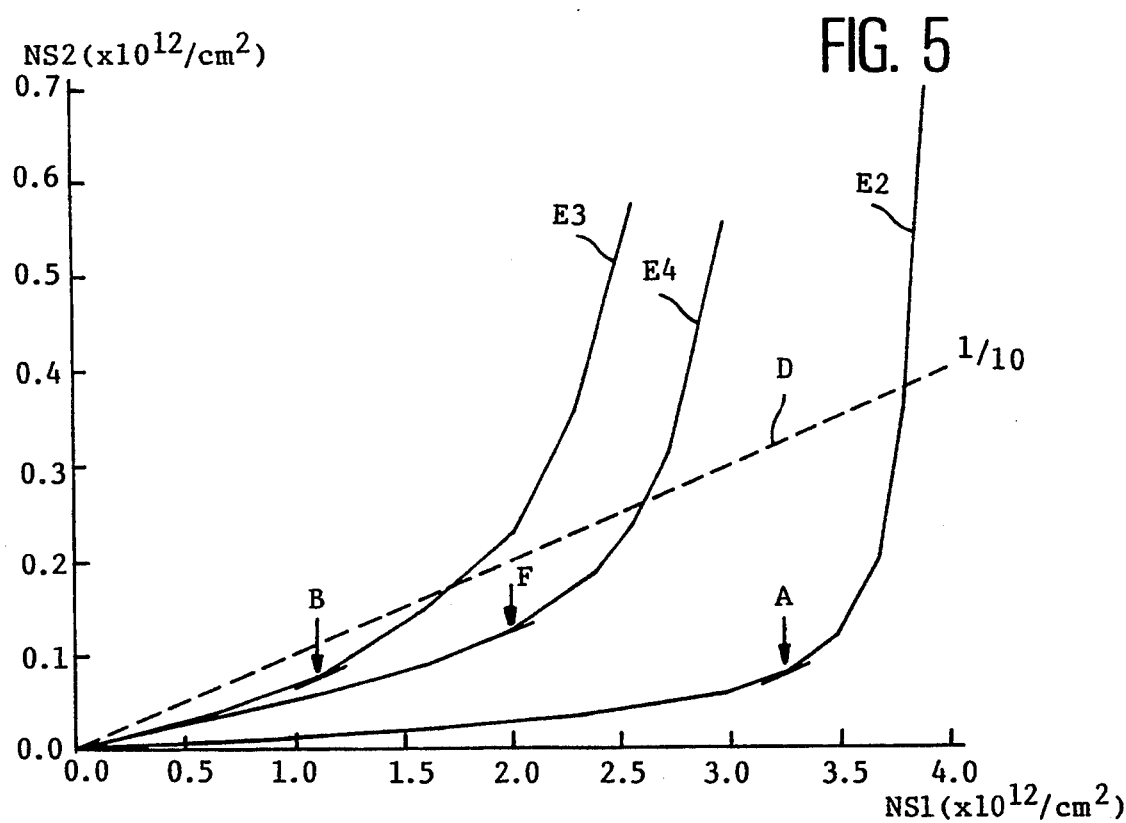
FIG. 5 the evolution of the two-dimensional electron concentration in parallel conduction, i.e. NS2, as a function of the electron concentration in the conduction channel, i.e. NS1, respectively for the band structures of FIGS. 2, 3 and 4.

Curves E2,E3 and E4 of FIG. 5 represent the respective evolutions of the two-dimensional electron concentration in parallel conduction, i.e. NS2, as a function of the electron concentration NS1 in the conduction stack 6, respectively for the structures of Example 1, the counter-example and Example 2.

FIG. 5 shows at A,B and C the gradients 1/10 of the curves respectively E2,E3 and E4 and the line D is plotted which corresponds to NS2/NS1=10%.

It can be seen that the disturbed structure of Example 1 (curve E2) recovers 2.2 times more useful electrons than the undisturbed structure (curve E3) for the same parallel conduction NS2/NS1=10%. Thus, for NS2/NS1=10%, it is possible to obtain $1.7 \cdot 10^{12}$ electorns/cm² in the conduction stack of the undisturbed structures as opposed to $3.7 \cdot 10^{12}$ electrons/cm² in the conduction stack of the disturbed structure according to the invention.

For values close to the charge control dNS2/dNS1=0.1 (gradient in A and B of curves E2 and E3), NS1 is increased by a factor close to 3 on passing from the undisturbed structure (curve E3) to the structure according to the invention (curve E2).

On comparing curves E3 and E4, it can be seen that the disturbed structure of Example 2 recovers more useful electrons than the undisturbed structure for the same parallel conduction NS2/NS1=10%, $1.7 \cdot 10^{12}$ as against $2.6 \cdot 10^{12}$ electrons/cm². For values close tot he charge control dNS2/dNS1=0.1 (gradient F and B), NS1 is increased by a factor of approximately 2.

EXAMPLE 3

This example relates to HEMT of type n-$Al_{0.48}In_{0.52}As/In_{0.53}Ga_{0.47}As/InP$, with a conduction nonchannel and planar doping of $6 \cdot 10^{12}$ electron donor atoms/cm². In this example, the alloys InGaAs and InAlAs are substantially adapted to the InP substrate.

This transistor has three AlAs potential barriers in the donor stack and two InAs potential wells in the conduction stack. Moreover, this transistor has an $Al_{0.48}In_{0.52}As$ potential barrier layer between the buffer layer and the conduction stack, which is not an electron donor so as to prevent electrons from passing out of the conduction channel.

| | Layer | Doping | Thickness |
|---|---|---|---|
| Contact | $In_{0.53}Ga_{0.47}As$ | $2 \cdot 10^{18}/cm^3$ | 5 nm |
| | $Al_{0.48}In_{0.52}As$ | nid | 20 nm |
| | AlAs | nid | 0.6 nm |
| Donor stack | $Al_{0.48}In_{0.52}As$ | nid | 2.4 nm |
| | AlAs | nid | 0.6 nm |
| | $Al_{0.48}In_{0.52}As$ | nid | 2.4 nm |
| | doping plane | $6 \cdot 10^{12}$ at $\cdot$ Si/cm² | — |
| | $Al_{0.48}In_{0.52}As$ | nid | 2.4 nm |
| | AlAs | nid | 0.6 nm |
| | $In_{0.53}Ga_{0.47}As$ | nid | 5 nm |
| | InAs | nid | 0.6 nm |
| Conduction stack | $In_{0.53}Ga_{0.47}As$ | nid | 10 nm |
| | InAs | nid | 0.6 nm |
| | $In_{0.53}Ga_{0.47}As$ | nid | 5 nm |
| Barrier | $Al_{0.48}In_{0.52}As$ | nid | 20 nm |
| Buffer | InP | nid | 1 μm |
| Substrate | InP | semiinsulating | — |

EXAMPLE 4

This example relate to a HEMT having two types of n-$Al_{0.22}Ga_{0.78}As/In_{0.15}Ga_{0.85}As/GaAs$ conduction channels with two doping planes of respectively $5 \cdot 10^{12}$ and $1.5 \cdot 10^{12}$ at/cm² as electron donors,. This transistor has three AlAs potential barriers in the two mobile charge donor stacks and two InAs potential wells in the conduction stack located between the two charge donor stacks.

| | Layer | Doping | Thickness |
|---|---|---|---|
| Contact | GaAs N+ | $2 \cdot 10^{18}/cm^3$ | 100 nm |
| | $Al_{0.22}Ga_{0.78}As$ | nid | 19 nm |
| | AlAs | nid | 0.6 nm |
| Donor stack | $Al_{0.22}Ga_{0.78}As$ | nid | 2.4 nm |
| | AlAs | nid | 0.6 nm |
| | $Al_{0.22}Ga_{0.78}As$ | nid | 2.4 nm |
| | doping plane | $5 \cdot 10^{12}$ at $\cdot$ Si/cm² | — |
| | $Al_{0.22}Ga_{0.78}As$ | nid | 2.4 nm |
| | AlAs | nid | 0.6 nm |
| | $In_{0.15}Ga_{0.85}As$ | nid | 3 nm |
| Conduction stack | InAs | nid | 0.6 nm |
| | $In_{0.15}Ga_{0.85}As$ | nid | 4.8 nm |
| | InAs | nid | 0 6 nm |
| | $In_{0.15}Ga_{0.85}As$ | nid | 3 nm |
| | AlAs | nid | 0.6 nm |

-continued

| Layer | | Doping | Thickness |
|---|---|---|---|
| Donor stack | $Al_{0.22}Ga_{0.78}As$ | nid | 4.5 nm |
| | doping plane | $1.5 \cdot 10^{12}$ at $Si/cm^2$ | — |
| | $Al_{0.22}Ga_{0.78}As$ | nid | 0.6 |
| | AlAs | nid | 0.6 nm |
| | $Al_{0.22}Ga_{0.78}As$ | nid | 6 nm |
| | AlAs | nid | 0.6 nm |
| Buffer | GaAs | nid | 1 μm |
| Substrate | GaAs | semiinsulating | — |

We Claim:

1. A field effect transistor comprising:
   a. a semiinsulating substrate,
   b. at least one first stack (6) of semiconductive conduction layers with a first concentration of carriers, said first stack forming a conduction channel,
   c. at least one second stack (8) of semiconductive, mobile electric charge donor layers, said second stack having a second concentration of carriers and comprising a single highly doped thin film (18) giving to said second stack a donor character, at least two potential barriers (17, 19) located in said second stack, respectively on either side of the highly doped thin film in order to reduce the second concentration of carriers in said second stack, and other layers (20, 22) in said second stack, each barrier (17, 19) comprising at least one semiconductive monolayer of a material having a forbidden energy band greater than those of the other layers (20, 22) of the second stack, said first and second stacks being superimposed on the substrate (2),
   d. a metal gate (G) formed on the second stack to modify the first concentration of charge carries in the first stack,
   e. two ohmic contacts (S, D) placed on one of the stacks, on either side of the gate, and serving respectively as a source and a drain, and
   f. at least one potential well (12) in said first stack in order to increase the first concentration of carries in the first stack, said well (12) comprising at least one semiconductor monolayer of a material having a forbidden energy band below those of the other layers (14, 16) of the first stack,
   and wherein the substrate (2) comprises GaAs, said other layers (14, 16) of the first stack (6), other than the potential well (12) comprise $In_xGa_{1-x}As$ with $x \leq x \leq 1$, the potential well (12) comprises $In_{xo}Ga_{1-xo}As$ with $x < xo \leq 1$, said other layers (20, 22) of the second stack, other than the potential barriers, comprise $Al_yGa_{1-y}As$ with $0 < y \leq 1$, and the potential barriers (17, 19) comprise $Al_{yo}Ga_{1-yo}As$ with $y < yo \leq 1$.

2. A transistor according to claim 1, wherein $xo = 1$; $0.20 < y < 1$; and $yo = 1$.

3. A transistor according to claim 1, wherein a not intentionally doped, semiconductor buffer layer (4) is provided between the substrate and the first layer stack, and said buffer layer and the substrate are made of a similar material.

4. A transistor according to claim 1, wherein a highly coped semiconductor material (10) is interposed between the second stack and respectively the source and drain, and said material and the substrate are made of a similar material.

5. A field effect transistor comprising:
   a. a semiconductor substrate,
   b. at least one first stack (6) of semiconductive conduction layers with a first concentration of carriers, said first stack forming a conduction channel,
   c. at least one second stack (8) of semiconductive mobile electric charge donor layers, said second stack having a second concentration of carriers and comprising a single highly doped thin film (18) giving to said second stack a donor character, at least two potential barriers (17, 19) located in said second stack, respectively on either side of the highly doped thin film in order to reduce the second concentration of carriers in said second stack, and other layers (20, 22) in said second stack, each barrier (17, 19) comprising at least one semiconductive monolayer of a material having a forbidden energy band greater than those of the other layers (20, 22) of the second stack, said first and second stacks being superimposed on the substrate (2),
   d. a metal gate (G) formed on the second stack to modify the first concentration of charge carriers in the first stack,
   e. two ohmic contacts (S, D) placed on one of the stacks, on either side of the gate, and serving respectively as a source and a drain, and
   f. at least one potential well (12) in said first stack in order to increase the first concentration of carriers in the first stack, said well (12) comprising at least one semiconductor monolayer of a material having a forbidden energy band below those of the other layers (14, 16) of the first stack,
   and wherein the substrate comprises GaAs, the layers (14, 16) of the first stack (6), other than the potential well (12), comprise $In_xGa_{1-x}As$ with $0 \leq x < 1$, the potential well (12) comprises $In_{xo}Ga_{1-xo}As$ with $x - xo \leq 1$, the layers (20, 22) of the second stack, other than the potential barriers, comprise $In_zGa_{1-z}P$ with $0 < z \leq 0.7$ and the potential barriers (17, 19) comprise $In_{zo}Ga_{1-zo}P$ with $0 \leq zo \leq z$.

6. A transistor according to claim 5, wherein a not intentionally doped, semiconductor buffer layer (4) is provided between the substrate and the first layer stack, and said buffer layer and the substrate are made of a similar material.

7. A transistor according to claim 5, wherein a highly doped semiconductor material (10) is interposed between the second layer stack and respectively the source and drain, and said material and the substrate are made of a similar material.

8. A field effect transistor comprising:
   a. a semiinsulating substrate,
   b. at least one first stack (6) of semiconductive conduction layers with a first concentration of carriers, said first stack forming a conduction channel,
   c. at least one second stack (8) of semiconductive, mobile electric charge donor layers, said second stack having a second concentration of carriers and comprising a single highly doped thin film (18) giving to said second stack a donor character, at least two potential barriers (17, 19) located in said second stack, respectively on either side of the highly doped thin film in order to reduce the second concentration of carriers in said second stack, and other layers (20, 22) in said second stack, each barrier (17, 19) comprising at least one semiconductive monolayer of a material having a forbidden energy band greater than those of the other layers (20, 22) of the second stack, said first and second stacks being superimposed on the substrate (2), d. a metal gate (G) formed on the second stack to modify the first concentration of charge carriers in the first stack, e. two ohmic contacts (S, D) placed on one of the stacks, on either side of the gate, and serving respectively as a source and a drain, and f. at least one potential well (12) in said first stack in order to increase the first concentration of carriers in the first stack, said well (12) comprising at least one semiconductor monolayer of a material having a forbidden energy band below those of the other layers (14, 16) of the first stack, and wherein the substrate (2) comprises InP, said other layers (14, 16) of the first stack, other than the potential well (12), comprise $In_tGa_{1-t}As$ with $0.3 \leq u \leq 1$, the layers (20, 22) of the second stack, other than the potential barriers (18), comprise $Al_uIn_{1-u}As$ with $0.3 \leq u \leq 1$ and the potential barriers (17, 19) comprise $Al_{uo}In_{1-uo}As$ with $u < uo \leq 1$.

9. A transistor according to 8, wherein a not intentionally doped, semiconductor buffer layer (4) is provided between the substrate and the first layer stack, and said buffer layer and the substrate are made of a similar material.

10. A transistor according to claim 8, wherein a highly doped semiconductor material (10) is interposed between the second layer stack and respectively the source and drain, and said material and the substrate are made of a similar material.

11. A field effect transistor comprising:

a. a semiinsulating substrate, b. at least one first stack (6) of semiconductive conduction layers with the first concentration of carriers, said first stack forming a conduction channel, c. at least one second stack (8) of semiconductive, mobile electric charge donor layers, said second stack having a second concentration of carriers and comprising a single highly doped thin film (18) giving to said second stack a donor character, at least two potential barriers (17, 19) located in said second stack, respectively on either side of the highly doped thin film in order to reduce the second concentration of carriers in said second stack, and other layers (20, 22) in said second stack, each barrier (17, 19) comprising at least one semiconductive monolayer of a material having a forbidden energy band greater than those of the other layers (20, 22) of the second stack, said first and second stacks being superimposed on the substrate (2), d. a metal gate (G) formed on the second stack to modify the first concentration of charge carriers in the first stack, e. two ohmic contacts (S, D) placed on one of the stacks, on either side of the gate, and serving respectively as a source and a drain, and f. at least one potential well (12) in said first stack in order to increase the first concentration of carriers in the first stack, said well (12) comprising at least one semiconductor monolayer of a material having a forbidden energy band below those of the other layers (14, 16) of the first stack, and wherein the substrate comprises GaAs, the layers (14, 16) of the first stack (6), other than the potential well (12), comprise $In_xGa_{1-x}As$ with $0 \leq x < 1$, the potential well (12) comprises $In_{xo}Ga_{1-xo}As$ with $XO=1$, the layers (20, 22) of the second stack, other than the potential barriers, comprise $In_zGa_{1-z}P$ with $0 < z \leq 0.7$ and the potential barriers (17, 19) comprise $In_{zo}Ga_{1-zo}P$ with $ZO=0$.

12. A field effect transistor comprising:

a. semiinsulating substrate, b. at least one first stack (6) of semiconductive conduction layers with a first concentration of carriers, said first stack forming a conduction channel, c. at least one second stack (8) of semiconductive, mobile electric charge donor layers, said second stack having a second concentration of carriers and comprising a single highly doped thin film (18) giving to said second stack a donor character, at least two potential barriers (17, 19) located in said second stack, respectively on either side of the highly doped thin film in order to reduce the second concentration of carriers in said second stack, and other layers (20, 22) in said second stack, each barrier (17, 19) comprising at least one semiconductive monolayer of a material having a forbidden energy band greater than those of the other layers (20, 22) of the second stack, said first and second stacks being superimposed on the substrate (2), d. a metal gate (G) formed on the second stack to modify the first concentration of charge carriers in the first stack, e. two ohmic contacts (S, D) placed on one of the stacks, on either side of the gate, and serving respectively as a source and a drain, and f. at least one potential wall (12) in said first stack in order to increase the first concentration of carriers in the first stack, said well (12) comprising at least one semiconductor monolayer of a material having a forbidden energy band below those of the other layers (14, 16) of the first stack, and wherein the substrate (2) comprises InP, said other layers (14, 16) of the first stack, other than the potential well (12), comprise $In_tGa_{1-t}As$ with $0.3 \leq t \leq 1$, the potential well (12) comprises $In_{to}Ga_{1-to}As$ with $to=1$, the layers (20, 22) of the second stack, other than the potential barriers (18), comprise $Al_uIn_{1-u}As$ with $0.3 \leq u \leq 1$ and the potential barriers (17, 19) comprise $Al_{uo}In_{1-uo}As$ with $uo=1$.

* * * * *

UNITED STATES PATENT AND TRADEMARK OFFICE
CERTIFICATE OF CORRECTION

PATENT NO. : 5,343,057
DATED : August 30, 1994
INVENTOR(S) : Gerard et al

It is certified that error appears in the above-indentified patent and that said Letters Patent is hereby corrected as shown below:

Claim 1, Col. 11, line 41, "carries" should be --carriers--

Claim 4, Col. 11, line 63, "coped" should be --doped--

Claim 5, Col. 11, line 68, "semiconductor" should be --semiinsulating--

Claim 8, Col. 13, line 16, before "the" (first occurence) insert --the potential well (12) comprises $In_tGa_{1-t}As$ with $t \leq to \leq 1$,--

Claim 12, Col. 14, line 41, "wall" should be --well--

Signed and Sealed this

Twenty-third Day of May, 1995

*Attest:*

BRUCE LEHMAN

*Attesting Officer*   *Commissioner of Patents and Trademarks*